(12) United States Patent
Manning

(10) Patent No.: US 6,301,322 B1
(45) Date of Patent: Oct. 9, 2001

(54) BALANCED DUAL-EDGE TRIGGERED DATA BIT SHIFTING CIRCUIT AND METHOD

(75) Inventor: Troy A. Manning, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/298,799

(22) Filed: Apr. 23, 1999

(51) Int. Cl.$^7$ ..................................................... G11C 19/00
(52) U.S. Cl. ................................. 377/54; 377/26; 377/73; 377/78; 377/80; 365/230.08; 365/233; 365/240; 326/94; 327/292; 327/296
(58) Field of Search ............................... 365/240, 230.08, 365/233; 377/26, 54, 73, 78, 80; 326/94; 327/292, 296

(56) References Cited

U.S. PATENT DOCUMENTS 5,852,378 * 12/1998 Keeth .................................... 327/171
5,926,520 * 7/1999 Yano ...................................... 377/80

* cited by examiner

*Primary Examiner*—Margaret R. Wambach
(74) *Attorney, Agent, or Firm*—Dorsey & Whitney LLP

(57) ABSTRACT

A balanced dual-edge triggered bit shifting circuit includes a clock circuit to generate low skew, or edge-aligned, complementary clock signals, and a shift register that shifts a data bit in response to the complementary clock signals. The clock circuit is formed from two clock generators, each of which generates the edge-aligned complementary clock signals by alternatively coupling the input terminals of two buffer circuits to a voltage supply terminal and a ground terminal. Transfer gates coordinate the coupling of the input terminals of the buffer circuits so that the resulting output clock signals generated by each clock generator have clock transitions that are substantially simultaneous. The shift register is formed from at least one shift register stage that receives the edge-aligned complementary clock signals. The shift register stage includes two latching stages, each latching stage having an inverter with an output coupled to a latch circuit. The inverters of each latching stage are alternatively enabled by coupling each one through a switching mechanism to a supply voltage terminal and a ground terminal, thereby shifting the data bit from one latch circuit to the other. The switching mechanism is rendered conductive based on the logic states of the two sets of edge-aligned complementary clock signals generated by the clock circuit.

58 Claims, 8 Drawing Sheets

BALANCED DUAL-EDGE TRIGGERED DATA BIT SHIFTING CIRCUIT AND METHOD

TECHNICAL FIELD

The present invention relates to integrated circuit devices, and more particularly, to a bit shifting circuit and method used in memory devices.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium II® microprocessors are currently available that operate at clock speeds of at least 400 MHz. However, the remaining components of existing computer systems, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a frequency that is substantially lower than the clock frequency of the processor. Currently, for example, a processor having a 300 MHz clock frequency may be mounted on a mother board having a 66 MHz clock frequency for controlling the system memory devices and other components.

Access to system memory is a frequent operation for the processor. The time required for the processor, operating, for example at 300 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a packetized memory device known as a SLDRAM memory device. In the SLDRAM architecture, the system memory may be coupled to the processor, either directly through the processor bus or through a memory controller. Rather than requiring that separate address and control signals be provided to the system memory, SLDRAM memory devices receive command packets that include both control and address information. The SLDRAM memory device then outputs or receives data on a data bus that may be coupled directly to the data bus portion of the processor bus.

An example of such a SLDRAM memory device is shown in FIG. 1. The memory device 30 includes a clock generator circuit 40 that receives a command clock signal CMDCLK and generates an internal clock signal ICLK and a large number of other clock and timing signals to control the timing of various operations in the memory device 30. The memory device 30 also includes a command buffer 46 and an address capture circuit 48, which receive the internal clock signal ICLK, a command packet CA0–CA9 on a 10-bit command bus 50, and a FLAG signal on line 52. A memory controller (not shown) or other device normally transmits the command packet CA0–CA9 to the memory device 30 in synchronism with the command clock signal CMDCLK. As explained above, the command packet, which generally includes four 10-bit packet words, contains control and address information for each memory transfer. The FLAG signal identifies the start of a command packet, and it also signals the start of an initialization sequence. The command buffer 46 receives the command packet from the bus 50, and compares at least a portion of the command packet to identifying data from an ID register 56 to determine if the command packet is directed to the memory device 30 or some other memory device (not shown). If the command buffer 46 determines that the command packet is directed to the memory device 30, it then provides the command words to a command decoder and sequencer 60. The command decoder and sequencer 60 generates a large number of internal control signals to control the operation of the memory device 30 during a memory transfer.

The address capture circuit 48 also receives the command words from the command bus 50 and outputs a 20-bit address corresponding to the address information in the command packet. The address is provided to an address sequencer 64, which generates a corresponding 3-bit bank address on bus 66, a 10-bit row address on bus 68, and a 7-bit column address on bus 70. The column address and row address are processed by column and row address paths 73, 75 as will be described below.

One of the problems of conventional DRAMs is their relatively low speed resulting from the time required to precharge and equilibrate circuitry in the DRAM array. The packetized DRAM 30 shown in FIG. 1 largely avoids this problem by using a plurality of memory banks 80, in this case eight memory banks 80a–h. After a read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86, redundant row circuit 87, or a refresh counter 88, as determined by a multiplexer 90. However, only one of the row latch/decoder/drivers 82a–h is active at any one time, as determined by bank control logic 94 as a function of a bank address from a bank address register 96.

The column address on bus 70 is applied to a column latch/decoder 100, which supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and the I/O gating circuit 102 and a data path subsystem 108, which includes a read data path 110 and a write data path 112. The read data path 110 includes a read latch 120 that stores data from the I/O gating circuit 102. In the memory device 30 shown in FIG. 3, 64 bits of data are stored in the read latch 120. The read latch 120 then provides four 16-bit data words to an output multiplexer 122 that sequentially supplies each of the 16-bit data words to a read FIFO buffer 124. Successive 16-bit data words are clocked into the read FIFO buffer 124 by a clock signal DCLK generated by the clock generator 40. The 16-bit data words are then clocked out of the read FIFO buffer 124 by a clock signal RCLK obtained by coupling the DCLK signal through a programmable delay circuit 126. The read FIFO buffer 124 sequentially applies the 16-bit data words to a driver circuit 128 in synchronism with the RCLK signal. The driver circuit, in turn, applies the 16-bit data words to a data bus 130. The driver circuit 128 also applies the data clock signal DCLK to a clock line 132. The programmable delay circuit 126 is programmed during initialization of the memory device so that the DCLK signal has the optimum phase relative to DCLK signal for the DCLK signal to clock the read data into the memory controller (not shown), processor, or other device.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. The clock generator circuit generates these enable signals responsive to the data clock DCLK, which, for write operations, is applied to the memory device 30 on line 132 from the memory controller, processor, or other device. As with the command clock signal CMDCLK and command packet CA0–CA9, the memory controller or other device (not shown) normally transmits the data to the memory device 30 in synchronism with the data clock signal DCLK. The clock generator 144 is programmed during initialization to adjust the timing of the clock signal applied to the input registers 142 relative to the DCLK signal so that the input registers can capture the write data at the proper times. Thus, the input registers 142 sequentially store four 16-bit data words and combine them into one 64-bit data word applied to a write FIFO buffer 148. The data are clocked into the write FIFO buffer 148 by a clock signal from the clock generator 144, and the data are clocked out of the write FIFO buffer 148 by an internal write clock WCLK signal. The WCLK signal is generated by the clock generator 40. The 64-bit write data are applied to a write latch and driver 150. The write latch and driver 150 applies the 64-bit write data to one of the memory banks 80a–h through the I/O gating circuit 102 and the sense amplifiers 104.

The command buffer 46 is shown in greater detail in the block diagram of FIG. 2. With reference to FIG. 2, a command packet consisting of a plurality of packet words are applied to a shift register 172 via the command bus 50. The shift register 172 sequentially receives packet words responsive to a clock signal CLK. The shift register 172 has N stages, each of which has a width of M bits. Therefore, each command word can be M*N bits. After an M*N bit command word has been shifted into the shift register 172, the control circuit 174 generates a LOAD signal that is applied to a storage register 178. The storage register 178 then loads all of the data stored in the shift register 172.

After the storage register 178 has been loaded, it continuously outputs the M*N bit command word to a decoder 180, an ID register 182, and a compare circuit 184. The storage register 178 also outputs the command word on a bus 190, and the compare circuit generates a CHPSEL signal. As explained below, the CHPSEL signal, when active high, causes the memory device 30 containing the command buffer 46 to perform a function corresponding to the command word on the bus 190.

The function of the decoder 180, ID register 182, and comparator 184 is to examine the command word and determine whether the command word is intended for the memory device 30 containing the command buffer 46. If the command word is directed to the memory device 30, the comparator 184 generates an active CHPSEL signal which causes the memory device 30 to carry out the operation corresponding to the command word on the bus 190. Significantly, when the memory device 30 is carrying out that command, the next packet words are being shifted into the shift register 172. Thus, the memory device 30 containing the command buffer 46 is capable of continuously receiving and processing command words.

It will be understood that necessary portions of the command buffer 46 have been omitted from FIG. 2 in the interests of brevity since they are somewhat peripheral to the claimed invention. For example, the command buffer 46 will contain circuitry for pipelining command words output from the storage register 178, circuitry for generating lower level command signals from the command word, etc.

One consideration limiting the maximum rate at which the command buffer 46 can receive and provide command packets is the speed at which the plurality of shift registers included in the shift register 172 can shift data. A conventional shift register generally consists of flip-flops and gates that control the shift operation. The conventional shift register shifts data in response to a clock pulse, and has a throughput limited to the speed of the clock signal. Increasing the clock speed will increase the throughput of the shift register. However, this approach does not increase the throughput of the conventional shift register with respect to other memory circuits also operating according to the clock signal.

One approach to increasing throughput has been to use a shift register that shifts data on both the rising and falling edges of a clock signal. The result is a dual-edge shift register that can essentially shift data at twice the throughput of conventional shift registers that shift data in response to only one clock edge or one clock pulse.

The dual-edge shift register generally requires a series of clock signals to perform the faster rate of shifting and latching operations. For example, it may be necessary to provide both of a clock signal to the dual-edge shift register in order to alternatively shift and latch data in the shift register. However, the maximum rate at which the dual-edge shift register can accurately perform the shift and latch operations may be limited by the quality (i.e. symmetry) of the clock complementary signals generated for use by the shift register.

The conventional manner in which a series of complementary clock signals are generated involve inverting a clock signal through an inverter circuit. The output of the inverter circuit is the complementary clock signal provided to the dual-edge shift register. However, when generating the complementary clock signal in such a manner, the resulting complementary clock signal will be skewed from the original clock signal due to the propagation delay of the inverter circuit. In some instances, the complementary clock signal may be skewed by as much as 50 picoseconds.

Applying the and skewed complementary clock signals to the dual-edge shift register causes the duty cycles of the shifting and latching operations to be imbalanced. Consequently, as the clock rate increases, the likelihood of the shift register misshifting or latching erroneous data also increases. Although the time delay between the and complementary clock signals may be acceptable at current clock speeds, it may pose a problem for the next generation of faster memory systems. These problems associated with an imbalanced shift register will manifest themselves as system memory errors. Therefore, there is a need for a bit shifting circuit that has a high throughput and balanced duty cycles.

SUMMARY OF THE INVENTION

A bit shifting circuit having shifting operations with a more balanced duty cycle includes both a clock circuit and shift register. The clock circuit produces two sets of complementary clock signals from two input clock signals, where the clock transitions of the non-inverted and inverted clock signals of each set have a low-skew, or aligned clock edges. The two sets of complementary clock signals are provided to a shift register. The shift register shifts a data bit applied to an input terminal and shifts the data bit to an output terminal in response to the complementary clock signals.

The shift register includes at least one shift register stage that shifts and latches the data bit from an input terminal upon the clock transition of one set of complementary clock signals. The shift register stage then shifts and latches the data bit at an output terminal upon the clock transition of the other set of complementary clock signals. The shift register stages include two latching stages, each latching stage having an inverter with an output coupled to a latch circuit. The inverters of each latching stage are alternatively enabled by coupling each through a switching mechanism to a supply voltage terminal and a ground terminal, thereby shifting the data bit from one latch circuit to the other. The switching mechanism is rendered conductive based on the logic states of the two sets of complementary clock signals generated by the clock circuit.

DETAILED DESCRIPTION OF THE INVENTION

Figure 2:
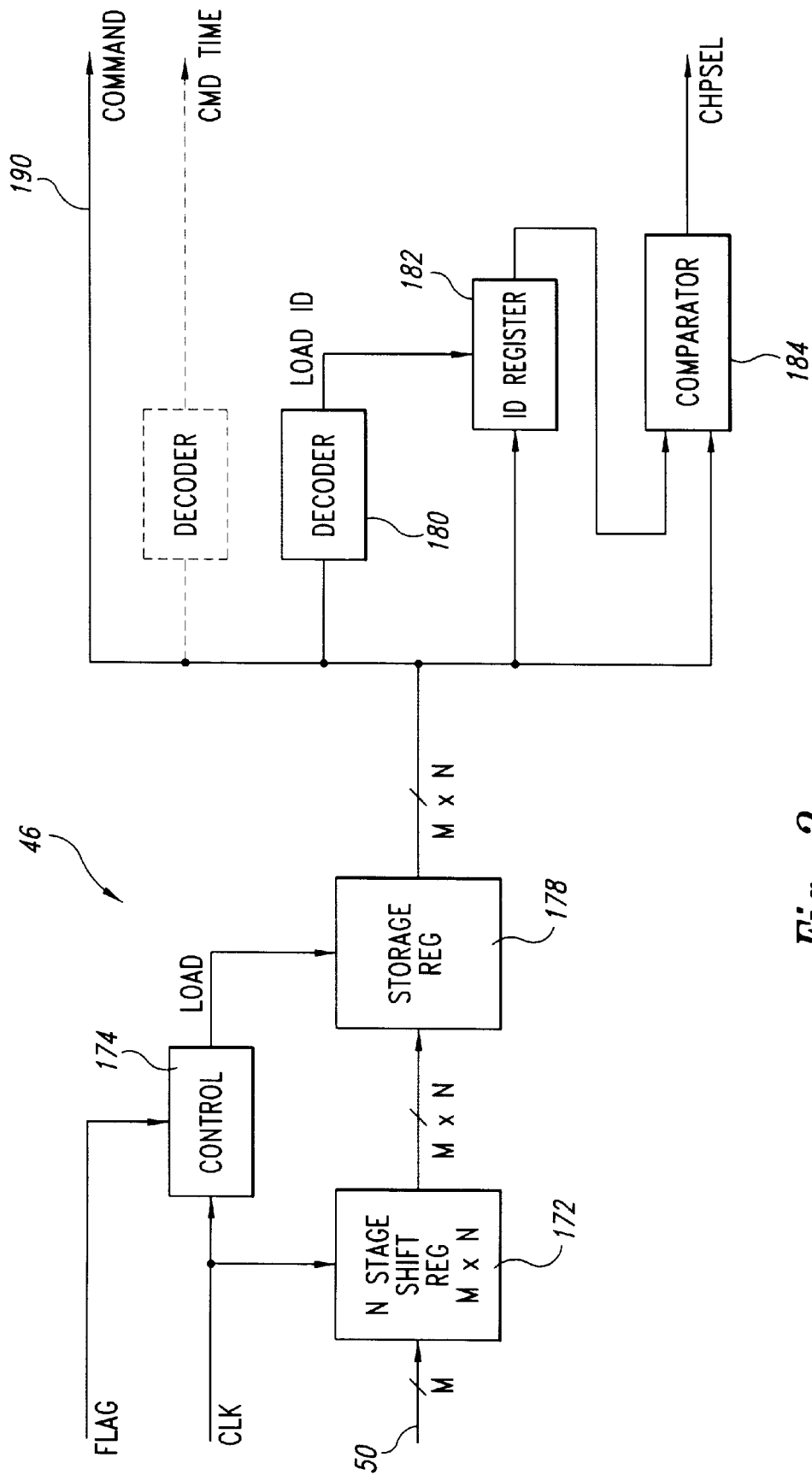
FIG. 2 is block diagram of a command buffer that is usable in the memory device of FIG. 1.
Figure 3:
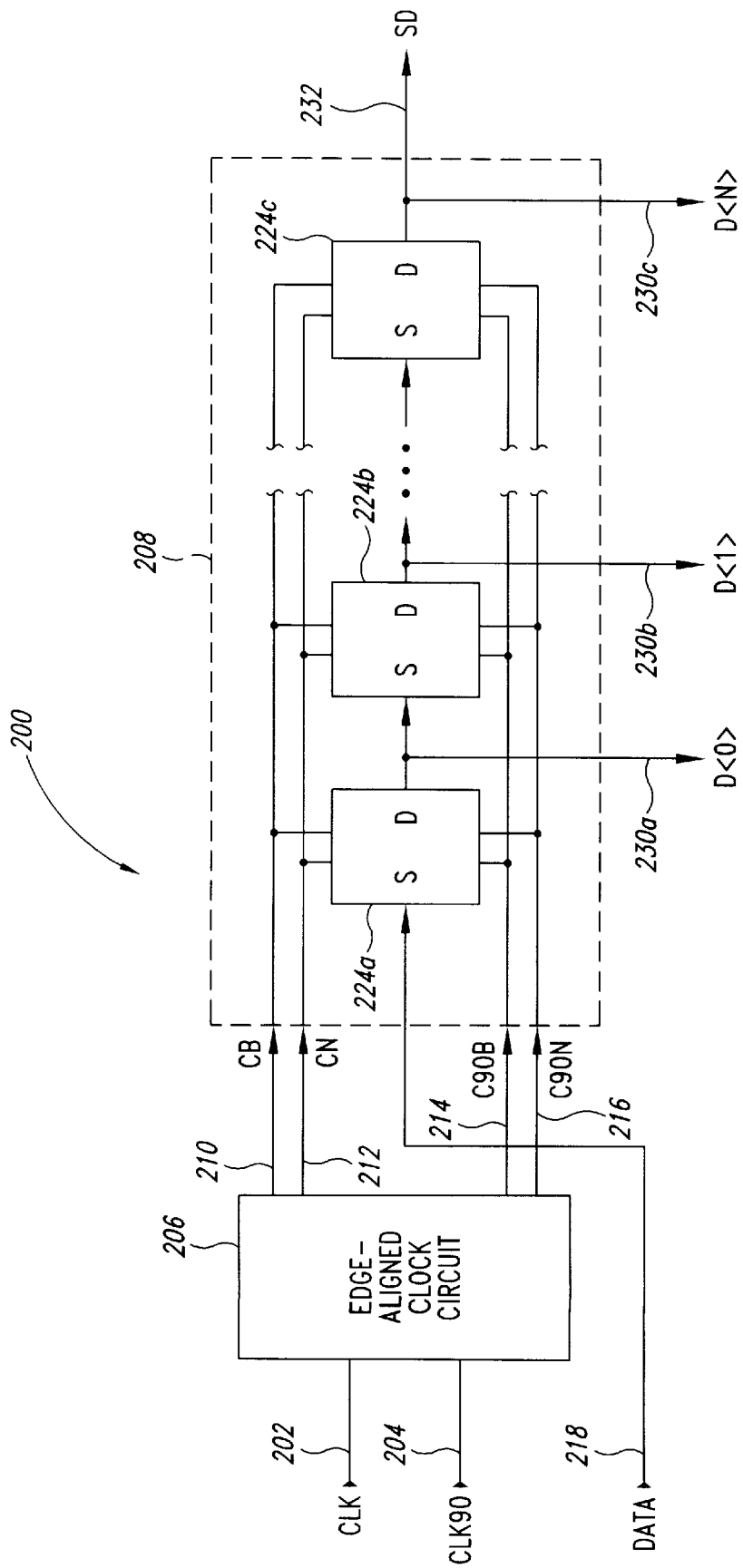
FIG. 3 is a block diagram of a bit shifting circuit according to an embodiment of the invention.

FIG. 3 illustrates an embodiment of a bit shifting circuit 200 in accordance to the principles of the present invention. The bit shifting circuit 200 may be substituted for a stage of the shift register 172 (FIG. 2). As shown in FIG. 3, the bit shifting circuit 200 is formed by the combination of an edge-aligned clock circuit 206 and a shift register 208. The edge-aligned clock circuit 206 receives a clock signal CLK at an input terminal 202 and its quadrature CLK90 at an input terminal 204. Both the CLK and CLK90 clock signals are generated elsewhere in the memory device by a clock generator circuit (not shown). The edge-aligned clock circuit 206 generates edge-aligned and complementary clock signals CB, CN and and complementary quadrature clock signals C90B, C90N from the CLK and CLK90 signals, respectively. "Edge-aligned" is defined herein as having relatively little skew between the clock transitions of. For example, a rising edge of the CB clock signal is substantially aligned with a falling edge of the CN clock signal. A more detailed explanation of how the edge-aligned clock circuit 206 generates edge-aligned complementary clock signals will be provided below.

Figure 1:
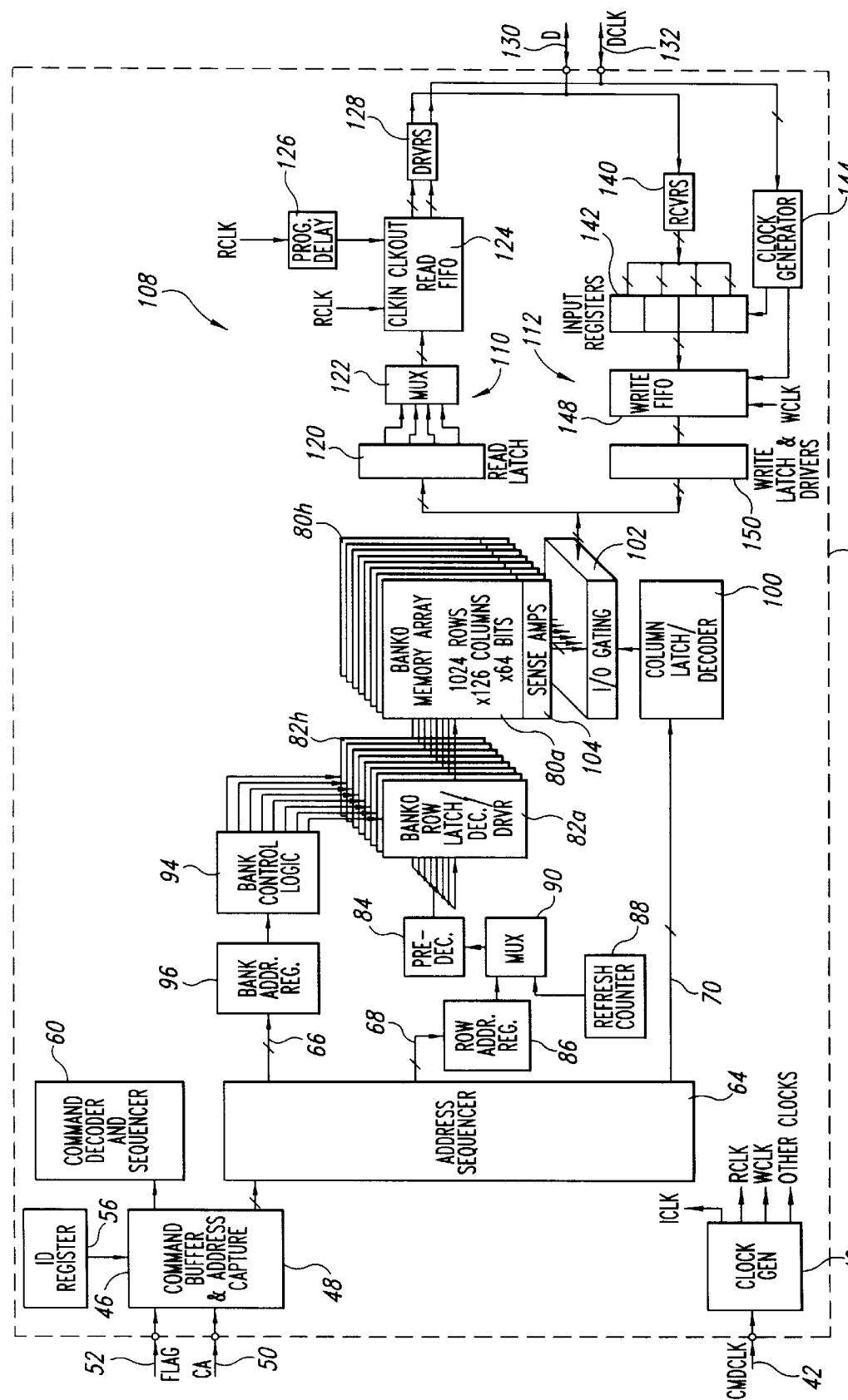
FIG. 1 is a block diagram of an SLDRAM memory device.

The shift register 208 receives the CB, CN and C90B, C90N clock signals on input clock terminals 210, 212, 214, and 216, respectively. The shift register 208 also receives a DATA signal at a serial data input terminal 218. The DATA signal is generally a serial stream of data bits such as a bit in each of a series of packet words applied to the command buffer 46 (FIG. 1). The shift register 208 includes at least one shift register stage 224a that is coupled to receive the CB, CN and C90B, C90N clock signals, and the DATA signal. However, the shift register 208 may include any number of shift register stages depending on the application of the bit shifting circuit 200. For example, with reference to FIG. 2, a suitable replacement for the shift register 172 would require N number of shift register stages. Additional shift register stages are represented in FIG. 3 by shift register stages 224b–c, where the shift register stage 224c represents the last stage in the shift register 208. Each shift register stage 224a–c is coupled to receive the CB, CN and C90B, C90N clock signals, and is coupled to receive a data bit, which is shifted from an input terminal S to an output terminal D. By connecting several shift register stages in series, a data bit applied to the serial data input terminal 218 can be shifted through each successive shift register stage 224a–c to an output terminal 232 in response to the CB, CN and C90B, C90N clock signals.

Although not essential to the operation of the bit shifting circuit 200, the shift register 208 may also include parallel output terminals 230a–c coupled to the output terminal D of each shift register stage 224a–c. The parallel output terminals 230a–c may be coupled to other circuits (not shown) in the memory device that extract a multi-bit word shifted bit-by-bit into the bit shifting circuit 200. For example, a bit shifting circuit 200 having N shift register stages may be used in the command buffer 46 (FIG. 1) of the memory device 30. Use of a shift register or bit shifting circuit in a command buffer is further described in U.S. Ser. No. 09/104, 423 to Maiming, filed Jun. 25, 1998, which is incorporated herein by this reference.

The edge-aligned clock circuit 206 in combination with the shift register 208 overcome the aforementioned problems associated with conventional shift registers by providing a bit shifting circuit 200 that has a more symmetrical or balanced duty cycle. The edge-aligned CB, CN and C90B, C90N clock signals generated by the clock circuit 206 enable the shift register stages 224a–c to perform the shifting and latching operations in a more balanced fashion. Thus, the likelihood that a shift register stage 224a–c will misshift a data bit resulting in a memory system error is reduced. As mentioned previously, as the clock speed of memory systems increases, the need for a more balanced bit shifting circuit will become more critical.

Figure 4:
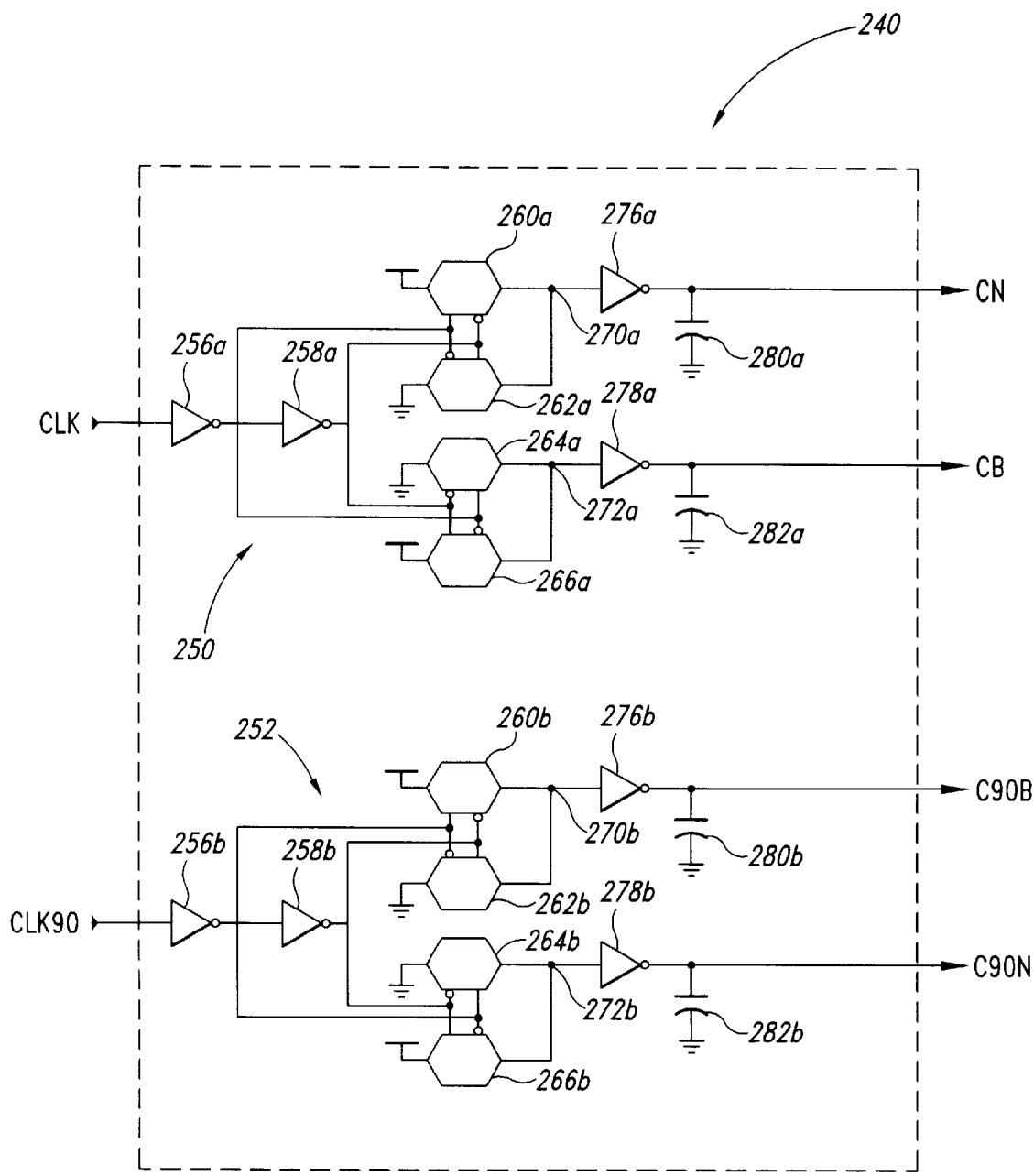
FIG. 4 is a schematic diagram of an edge-aligned clock circuit according to an embodiment of the invention.

An embodiment of an edge-aligned clock circuit 240 that may be used as the edge-aligned clock circuit 206 is shown in greater detail in FIG. 4. The edge-aligned clock circuit 240 includes two edge-aligned clock generators 250 and 252 that generate edge-aligned and complementary clock signals having clock transitions with relatively little skew. The edge-aligned clock generators 250, 252 are similar to a low-skew single-ended-to-differential signal converter described in U.S. Pat. No. 5,852,378 to Keeth, issued Dec. 22, 1998, which is incorporated herein by this reference.

With respect to the clock generator 250, it has two series connected inverters 256a, 258a, each having an output coupled to the complementary control terminals of conventional transfer gates 260a, 262a, 264a, and 266a. The transfer gates 260a, 262a, 264a, and 266a are conventional transfer gate circuits, and may be implemented by coupling a PMOS and NMOS transistor in parallel between the input and output terminals of the transfer gate. The transfer gates 260a and 266a have an input terminal coupled to a voltage supply terminal, and the transfer gates 262a and 264a have an input terminal coupled to a ground terminal. The inverter and twice-inverted clock signals of the inverters 256a, 258a coordinate the transfer gates 260a, 262a, 264a, and 266a to alternatively couple nodes 270a and 272a to the voltage supply or ground terminals. Consequently, as the CLK signal clocks back and forth, the voltage of the nodes 270a and 272a will change as well.

Although the output signal of the inverter 258a is delayed with respect to the output signal of the inverter 256a, inverters 276a and 278a act as buffers so that the complementary clock signals, CB and CN, have aligned clock edges. The control terminals coupled to the output of the inverter 258a will not receive the resulting clock signal as soon as the control terminals coupled to the output of the inverter 256a. However, the minor change in voltage of the nodes 270a and 272a due to the output signal of the inverter 256a arriving first will not be enough to trigger the inverters 276a and 278a, respectively. The inverters 276a and 278a will not trigger until the inverter 258a generates an output signal. Capacitors 280a and 282a may be coupled between the output of the inverters 276a and 278a and a ground, respectively, to filter any additional switching noise from the changing voltages at the nodes 270a and 272a.

Figure 6:
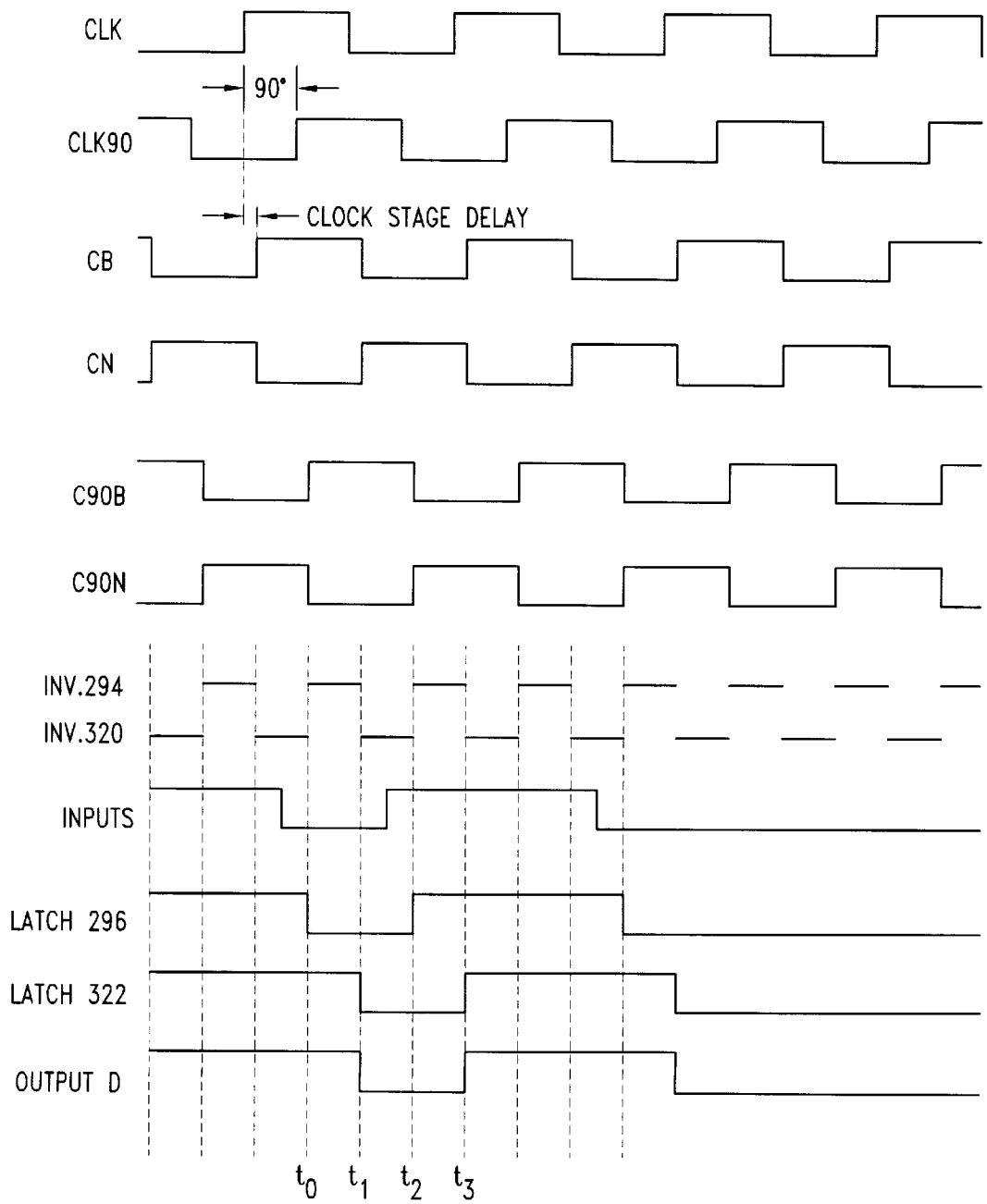
FIG. 6 is a timing diagram showing the clock signals present in the bit shifting circuit of FIG. 3.

The clock generator 252 is constructed and operates in the same manner as described above for the clock generator 250. However, the clock generator 252 receives an input clock signal CLK90, which is the quadrature of the CLK signal, and generates and complementary edge-aligned clock signals C90B and C90N, respectively. Illustrated in FIG. 6 are timing diagrams of the CB, CN, C90B, and C90N signals generated by the edge-aligned clock circuit 240. These signals will be applied to the shift register 208 to coordinate the shifting of data bits through the shift register 208.

Figure 5:
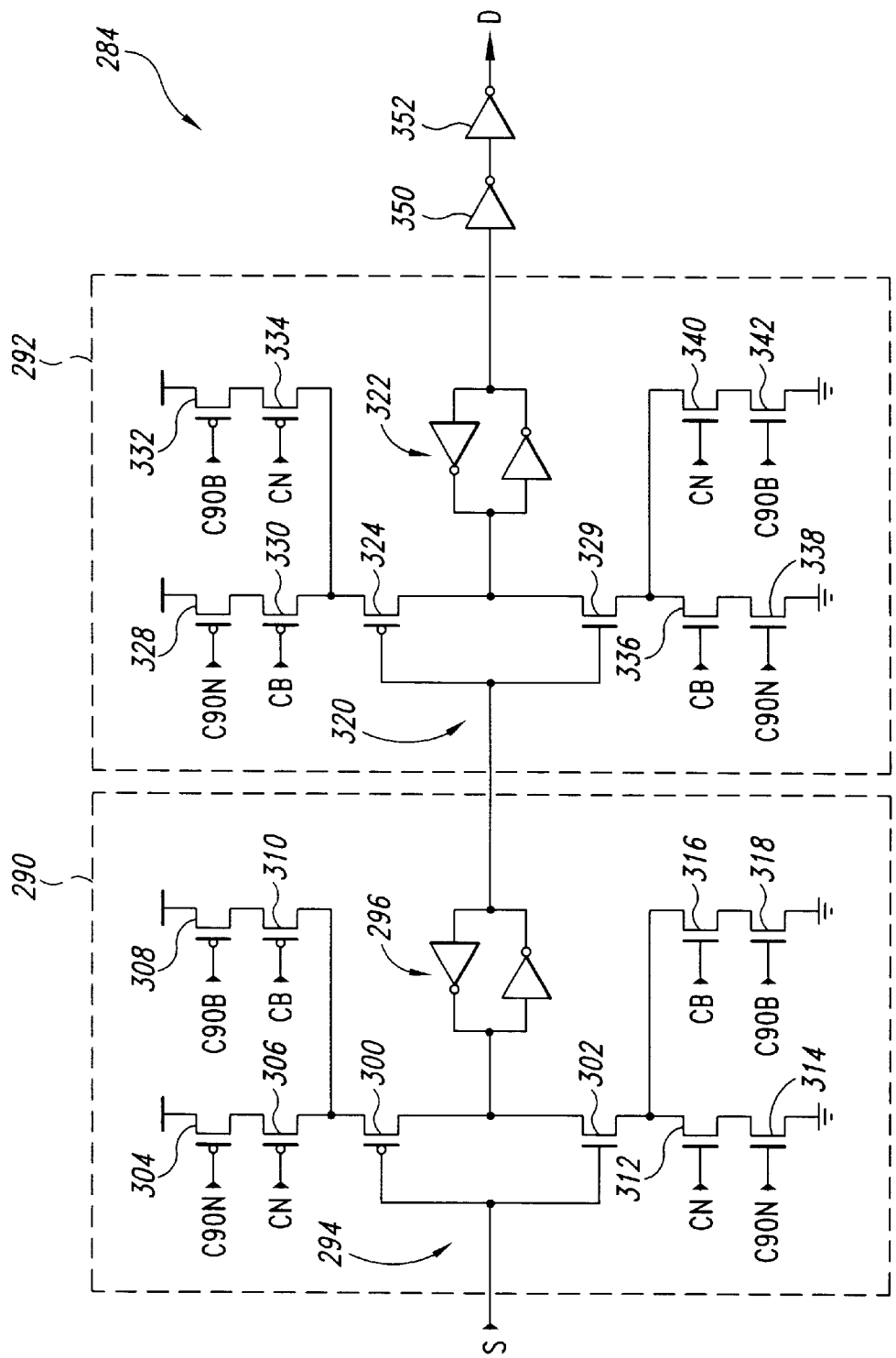
FIG. 5 is a schematic diagram of a shift register according to an embodiment of the invention.

FIG. 5 illustrates an embodiment of a shift register stage 284 that may be used for each shift register stage 224a–c (FIG. 3) of the shift register 208. The shift register stage 284 shifts a data bit at an input terminal S through two latch stages 290 and 292 to an output terminal D. Each of the latch stages 290, 292 shifts the data bit to a latch circuit upon receiving a combination of the CB, CN, C90B, and C90N signals generated by the edge-aligned clock circuit 206.

The latch stage 290 includes a CMOS inverter 294 having an input terminal S coupled to receive a data bit, and an output coupled to a latch circuit 296. The source of the PMOS transistor 300 is coupled to a voltage supply terminal through two pairs of series connected PMOS transistors 304, 306 and 308, 310. The source of the NMOS transistor 302 is coupled to a ground terminal through two pairs of series connected NMOS transistors 312, 314 and 316, 318. As shown in FIG. 5, a data bit at the input terminal S of the CMOS inverter 294 will be latched by the latch circuit 296 when the CMOS inverter is coupled to both the voltage supply terminal and the ground terminal. This will occur only when the C90N and CN signals are low and the CB and C90B signals are high, or alternatively, when the C90N and CN signals are low and the C90B and CB signals are high.

The latch stage 292 has a CMOS inverter 320 having an input terminal coupled to the output of the latch circuit 296, and an output terminal coupled to a latch circuit 322. The drains of the PMOS and NMOS transistors, 324 and 326, are coupled to the voltage supply terminal and the ground terminal, respectively, through an arrangement similar to the CMOS inverter 294. That is, PMOS transistors 328, 330 and 332, 334 are coupled to the source of the PMOS transistor 324, and NMOS transistors 336, 338 and 340, 342 are coupled to the source of the NMOS transistor 326. As shown in FIG. 5, the data bit latched by the latch circuit 296 will be shifted to the latch circuit 322 when the C90N and CB signals are low and the CN and C90B signals are high, or alternatively, when the C90B and CN signals are low and the C90N and CB signals are high.

Inverters 350 and 352 are coupled in series to the output of the latch circuit 322. The output of the inverter 352 is the output terminal D of the shift register 208. The inverters 350 and 352 act as buffers to the output of the latch circuit 322, and invert the shifted data so that a true version of the input data bit is provided at the output terminal D.

The operation of the shift register stage 284 in combination with the edge aligned clock circuit 106 will be explained with reference to FIG. 6. As shown in FIG. 6, the inverters 294 and 320 are alternatively activated twice for every cycle of the CLK clock signal, with only one inverter being activated at a given time. Thus, every time the inverters 294 and 320 are successively activated, a data bit is shifted through the shift register stage 284. Or similarly, two data bits can be shifted through the shift register stage 284 for every cycle of the CLK signal.

For example, one period of the CLK signal is defined by times t0–t3. At time t0, the inverter 294 is activated and a first (low) data bit at the input terminal S is latched by the latch circuit 296. At time t1, the inverter 294 is deactivated and the inverter 320 is simultaneously activated so that the first data bit of the latch circuit 296 can be shifted to the latch circuit 322. After a fixed time following time t1 (not shown in FIG. 6), due to the propagation delay of the inverters 350 and 352, the first data bit will appear at the output terminal D. At time t2, the inverter 320 is deactivated and the inverter 294 is once again activated. A second (high) data bit at the input terminal S is latched by the latch circuit 296. At time t3, the inverter 294 is deactivated and the inverter 320 is activated. Consequently, the second data bit latched by the latch circuit 296 is now shifted to the latch circuit 322. Soon thereafter, the second data bit will appear at the output terminal D. The clock period defined by the times t0–t3 will repeat so that two data bits will be shifted through the shift register stage 284 for every cycle of the CLK signal. As mentioned previously, several shift register stages 182 can be connected in series to form a multi-bit shift register, where a data bit is shifted through each succeeding shift register stage in response to the CB, CN, C90B, and C90N.

Although the sequence in which the individual transistors of a series transistor pair are turned ON is not critical, some advantages may be obtained by connecting the respective clock signals in a manner where the transistor coupled to the voltage supply or ground terminal is turned ON first. For example, turning ON the transistors 304 and 318 prior to turning ON the transistors 306 and 316 may result in the CMOS inverter 294 having a faster switching time. However, one ordinarily skilled in the art will appreciate that the shift register stage 284 will function regardless of which transistor is switched ON first.

Another embodiment of the bit shifting circuit 200 includes an edge aligned clock circuit 206 having an edge aligned clock circuit 240, as shown in FIG. 4, coupled to the output terminals of a clock circuit, as described in U.S. Ser. No. 09/104,423 to Manning, filed Jun. 25, 1998. The resulting clock circuit 206 is coupled to a shift register 208 that includes shift register stages as described in the aforementioned reference. Coupling the edge aligned clock circuit 240 to the output of the NAND and NOR gates of the clock circuit, as described in the reference, in place of the two pairs of series inverters results in a bit shifting circuit 200 that performs the shifting and latching operations in a more balanced fashion. The aforementioned reference was previously incorporated herein, and as such, a detailed explanation of the clock circuit and the shift register stage described in the reference have been omitted in the interests of brevity.

In applications where an M number of shift registers 208 (FIG. 1) are coupled in parallel, a person ordinarily skilled in the art will appreciate that an edge-aligned clock circuit 206 is not necessary for each of the shift registers 208. One edge-aligned clock circuit 206 may be used if the CB, CN, C90B, and C90N clock signals generated by the one clock circuit 206 are coupled to each of the M number of shift registers 208. An example of such an application is, as previously discussed, a command buffer that receives an M bit wide command word.

Figure 7:
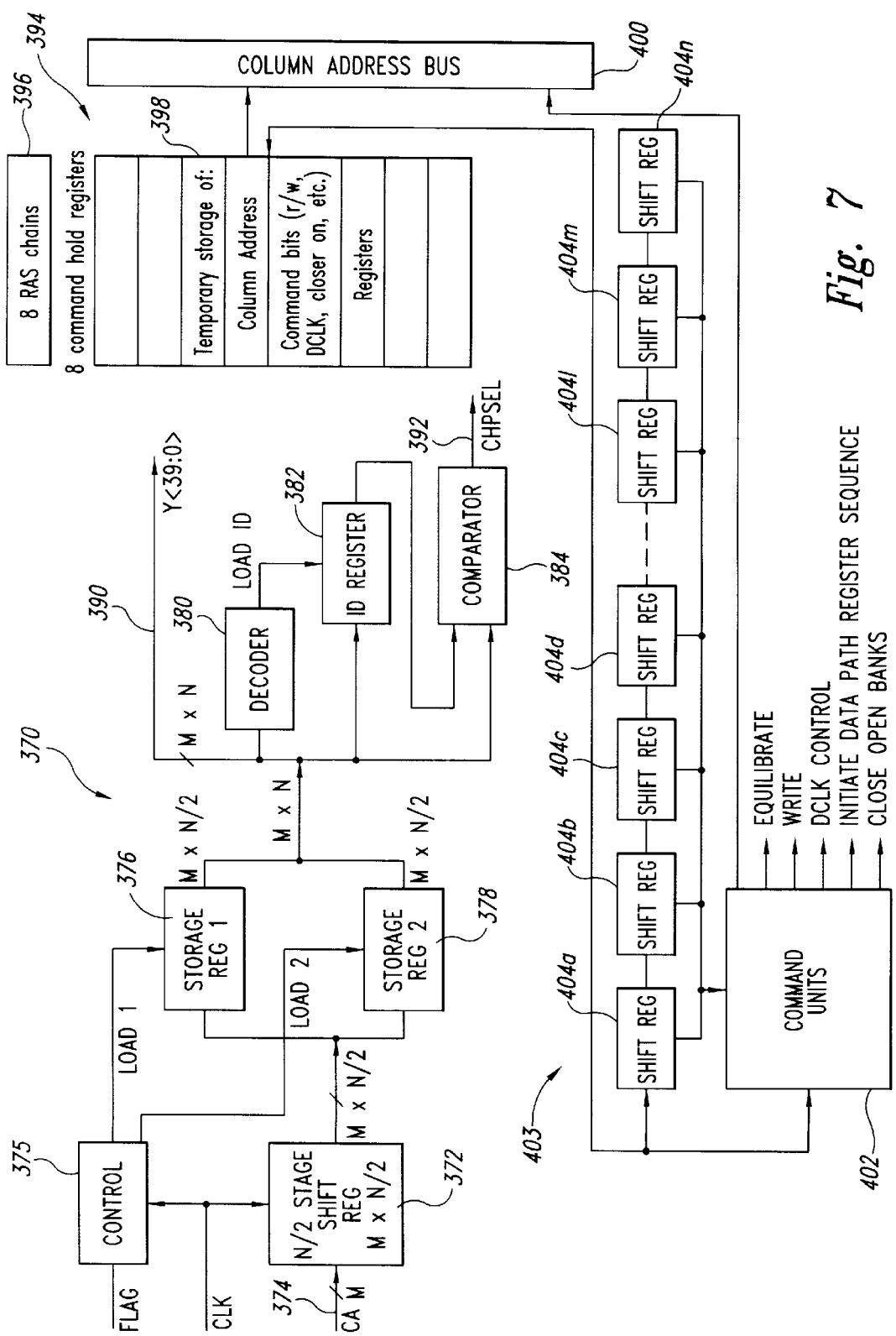
FIG. 7 is a block diagram of a command buffer usable in the memory device of FIG. 1 which includes the bit shifting circuit of FIG. 3.

Shown in FIG. 7 are portions of a command buffer 370 that includes embodiments of the bit shifting circuit 200 and that may be substituted for the command buffer 46 of FIG. 1. With reference to FIG. 7, the command buffer 370 receives a command packet CA consisting of a plurality of packet words. The packet words are applied to a shift register 372 via a command bus 374. The shift register 372 includes the bit shifting circuits shown in FIG. 3. The width M of the bus 374 corresponds to the size of the shift register 372, and the number N of packet words in the command packet corresponds to an integer sub-multiple of the number of stages of the shift register 372. The shift register 372 shown in FIG. 7 has one-half the number of stages that are in the command packet, i.e., two shift stages since there are four packet words. Thus, the shift register 372 sequentially receives two groups of two 10-bit packet words responsive to a clock signal CLK. Coincident with the start of a four word command packet, a FLAG signal is applied to a control circuit 375 that is clocked by the CLK signal along with the shift register 372.

After two packet words have been shifted into the shift register 372, the control circuit 375 generates a LOAD1 signal that is applied to a first storage register 376. The first two packet words from the shift register 372 are then loaded into the first storage register 376. After two more packet words have been shifted into the shift register 372, the control circuit 375 generates a LOAD2 signal that is applied to a second storage register 378. The remaining two packet words from the shift register 372 are then loaded into the second storage register 376. The first and second storage registers 376, 378 then collectively output a 40-bit command word Y<39:0> on a command bus 390.

The command word Y<39:0> on the command bus 390 is applied to a command unit 394 including a column command unit ("CCU") 398 and a row command unit ("RCU") 396 in accordance with one embodiment of the invention. The RCU 396 is responsible for processing row addresses and row commands while the CCU 398 is responsible for processing column addresses and column commands.

The CCU 398 outputs column and bank addresses to a column address bus 400, high level commands to a command execution unit 402, and timing signals to a sequencer 403 formed by a series of shift registers 404a–n. The shift registers 404 include the bit shifting circuit 200 shown in FIG. 3. The shift registers 404 control the timing of column commands issued by the command execution unit 402 responsive to command signals from the CCU 398.

The structure and operation of the command buffer 370 are described in greater detail in U.S. patent application Ser. No. 08/994,461 to Manning, filed Dec. 19, 1997, which is incorporated herein by this reference.

Figure 8:
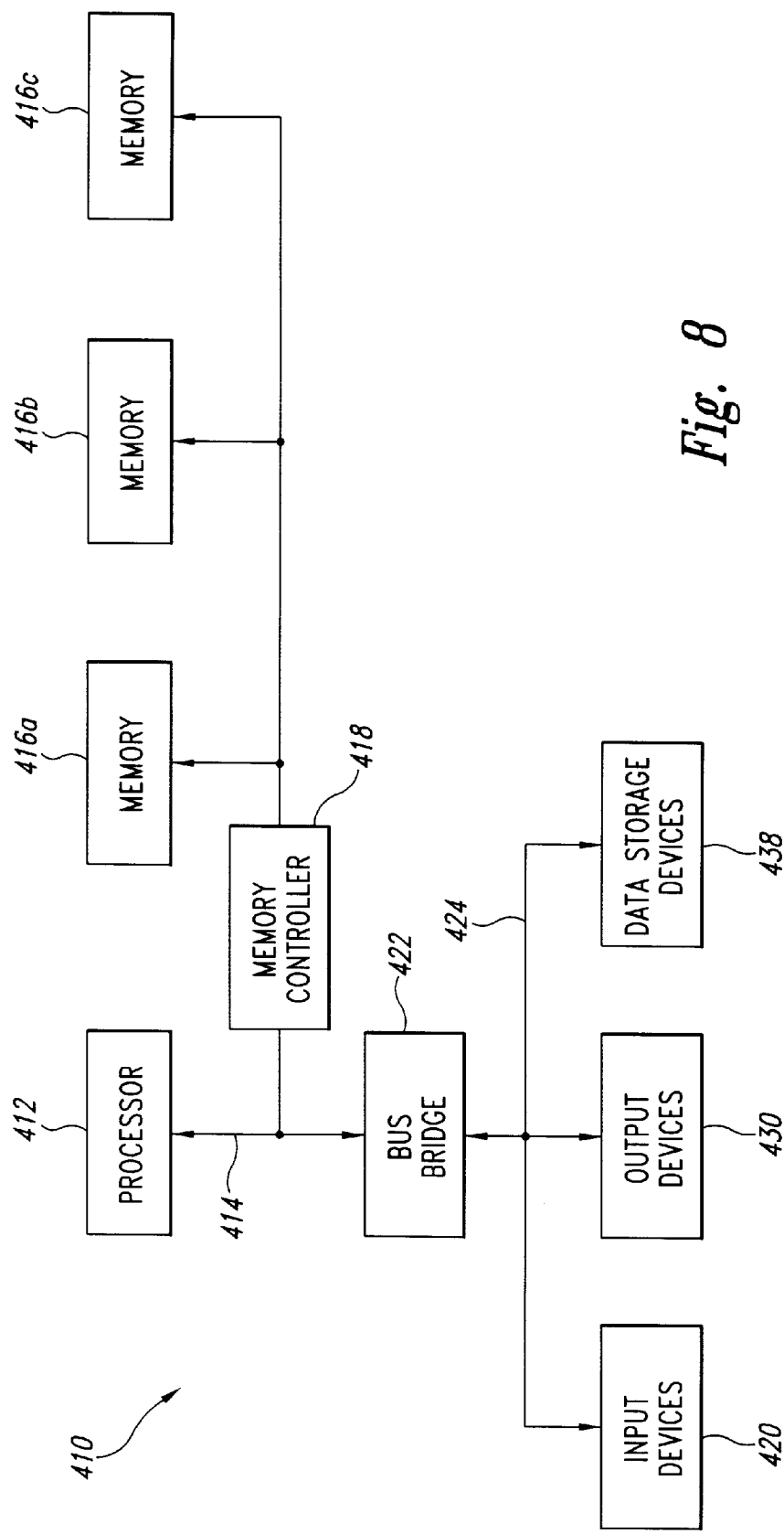
FIG. 8 is a block diagram of a computer system that includes memory devices having the bit shifting circuit of FIG. 3.

FIG. 8 is a block diagram of a computer system 410, which includes memory devices 416a–c including the bit shifting circuit 200 similar to those shown in FIG. 3. The computer system 410 includes a processor 412 having a processor bus 414 coupled to three SLDRAM packetized dynamic random access memory devices 416a–c through a memory controller 418. The computer system 410 also includes one or more input devices 420, such as a keypad or a mouse, coupled to the processor 412 through the processor bus 414, a bus bridge 422, and an expansion bus 424, such as an Industry Standard Architecture ("ISA") bus or a Peripheral Component Interconnect ("PCI") bus. The input devices 420 allow an operator or an electronic device to input data to the computer system 410. One or more output devices 430 are coupled to the processor 412 to display or otherwise output data generated by the processor 412. The output devices 430 are coupled to the processor 412 through the expansion bus 424, bus bridge 422 and processor bus 414. Examples of output devices 424 include printers and a video display units. One or more data storage devices 438 are coupled to the processor 412 through the processor bus 414, bus bridge 422, and expansion bus 424 to store data in or retrieve data from storage media (not shown). Examples of storage devices 438 and storage media include fixed disk drives floppy disk drives, tape cassettes and compact-disk read-only memory drives.

In operation, the processor 412 communicates with the memory devices 416a–c via the memory controller 418. The memory controller 418 sends the memory devices 416a–c command packets that contain both control and address information. Data is coupled between the processor 412 and the memory devices 416a–c through the memory controller 418 and the processor bus 414. Although all the memory devices 416a–c are coupled to the same conductors of the memory controller 418, only one memory device 416a–c at a time reads or writes data, thus avoiding bus contention. Bus contention is avoided by each of the memory devices 416a–c having a unique identifier, and the command packet containing an identifying code that selects only one of these components.

The computer system 410 also includes a number of other components and signal lines that have been omitted from FIG. 8 in the interests of brevity. For example, as explained below, the memory devices 416a–c also receive a command clock signal to provide internal timing signals, a data clock signal clocking data into the memory device 416, and a FLAG signal signifying the start of a command packet.

From the foregoing it will be appreciated that, although specific embodiments of the invention have been described herein for purposes of illustration, various modifications may be made without deviating from the spirit and scope of the invention. For example, as shown in FIG. 5, the latch stage 290 is activated when CN and C90N are low and CB and C90B are high, or when CN and C90N are high and CB and C90B are low, and the latch stage 292 is activated when CB and C90N are low and CN and C90B are high, or when CB and C90N are high and CN and C90B are low. However, the combination of the CN, CB, C90B, and C90N signals applied to the gates of the PMOS and NMOS series connected transistors may be changed so that the combination activating the latch stages 290 and 292 are switched. Accordingly, the invention is not limited except as by the appended claims.

What is claimed is:

1. A dual-edge triggered bit shifting circuit, comprising:
   a clock generator having a first clock circuit coupled to receive a first clock signal and a second clock circuit coupled to receive a second clock signal, each clock circuit having first and second output terminals to provide a respective pair of complementary clock signals, each clock circuit further having a first switch alternatively coupling the first output terminal to first and second reference voltages in response to first and second states of the respective clock signal received by the respective clock circuit, and further having a second switch alternatively coupling the second output terminal to the second and first reference voltages in response to the first and second states of the respective clock signal received by the respective clock circuit; and
   a shift register coupled to the output terminals of the first and second clock generators, and having an input terminal coupled to receive an input bit and an output terminal to provide an output bit, the shift register having a plurality of shift register stages coupled in series between the input and output terminals of the shift register, each shift register stage including:
   first and second latch stages coupled in series, the first latch stage latching a data bit in response to the first and second pairs of complementary clock signals having a first predetermined logic relationship, and the second latch stage latching the data bit from the first latch stage in response to the first and second pairs of complementary clock signals having a second predetermined logic relationship, whereby the data bit is shifted from the first latch stage to the second latch stage when the predetermined logic relationship of the first and second pairs of complementary clock signals changes, each latch stage including;
   an inverter having an input terminal to receive the data bit and an output terminal, the inverter further having first and second supply terminals;
   a first switching circuit coupled between a first reference terminal and the first supply terminal of the inverter, and further coupled to receive the first and second pairs of complementary clock signals, the first switching circuit coupling the first reference terminal to the first supply terminal in response to the predetermined logic relationship of the first and second pairs of complementary clock signals;
   a second switching circuit coupled between the second supply terminal of the inverter and a second reference terminal, and further coupled to receive the first and second pairs of complementary clock signals, the second switching circuit coupling second supply terminal to the second reference terminal in response to the predetermined logic relationship of the first and second pairs of complementary clock signals; and
   a latch circuit coupled to the output of the inverter to latch the data bit in response to the first and second supply-terminals of the inverter being coupled through the first and second switching circuits to the first and second reference terminals, respectively.

2. The bit shifting circuit of claim 1 wherein the first switching circuit comprises first and second pairs of series connected switches, each pair coupled between the first reference terminal and the first supply terminal, each switch having a control terminal coupled to receive a respective clock signal from the clock generator, and
   the second switching circuit comprises first and second pairs of series connected switches, each pair coupled between the second reference terminal and the second supply terminal, each switch having a control terminal coupled to receive a respective clock signal from the clock generator.

3. The bit shifting circuit of claim 2 wherein the first and second pairs of switches of the first switching circuit comprises PMOS transistors, and the first and second pairs of switches of the second switching circuit comprises NMOS transistors.

4. The bit shifting circuit of claim 1 wherein the latch circuit comprises two inverters each having an output terminal coupled to the input terminal of the other inverter.

5. The bit shifting circuit of claim 1 wherein the first and second clock circuits comprise:
   a first inverter having an input coupled to receive a respective clock signal and further having an output;
   a second inverter having an input coupled to the output of the first inverter and further having an output;
   first, second, third, and fourth transfer gates, each transfer gate having a respective input and output terminal, and further having first and second control terminals, wherein
   the input terminal of the first and fourth transfer gates are coupled to a first reference terminal, the input terminal of the second and third transfer gates are coupled to a second reference terminal,
   the output of the first inverter is coupled to the first control terminals of the first and third transfer gates, and the complementary control terminals of the second and fourth transfer gates, and
   the output of the second inverter is coupled to the first control terminals of the second and fourth transfer gates, and the second control terminals of the first and third transfer gates;
   a first output buffer having an input coupled to the output terminal of the first and second transfer gates, and further having an output terminal to provide the clock signal; and
   a second output buffer having an input coupled to the output terminal of the third and fourth transfer gates, and further having an output terminal to provide the complementary clock signal.

6. The bit shifting circuit of claim 5 wherein the first, second, third, and fourth transfer gates comprise first and second switches coupled in parallel between the input and output, the first switch having a gate terminal coupled to the first control terminal and the second switch having a gate terminal coupled to the second control terminal.

7. The bit shifting circuit of claim 1 wherein the second clock signal is a quadrature clock signal of the first clock signal.

8. A balanced dual edge triggered bit shifting circuit, comprising:

first and second clock circuits, each coupled to receive a single respective clock signal, and complimentary output terminals to provide first and second pairs of complementary clock signals, respectively, generated from the respective clock signal; and a shift register having input and output terminals, and further having first and second latch stages coupled in series between the input and output terminals, the first and second latch stages comprising:

an inverter having an input terminal coupled to receive a data bit and an output terminal, the inverter further having first and second supply terminals;

first and second pairs of series connected switches coupled between a first reference terminal and the first supply terminal of the inverter, and having control terminals coupled to receive the first and second pairs of complementary clock signals;

third and fourth pairs of series connected switches coupled between the second supply terminal of the inverter and a second reference terminal, and having control terminals coupled to receive the first and second pairs of complementary clock signals; and a latch coupled to the output of the inverter to latch the data bit in response to the inverter being activated when one of the first or second and one of the third or fourth pairs of series connected switches are simultaneously conductive.

9. The bit shifting circuit of claim 8 wherein each shift register stage comprises:

a first latch stage coupled to receive a data bit, the first latch stage latching the data bit in response to a first logic relationship of the first and second non-complementary and complementary clock signals; and a second latch stage coupled to receive the data bit from the first latch stage, the second latch stage latching the data bit in response to a second logic relationship of the first and second non-complementary and complementary clock signals, whereby the data bit is shifted from the first latch stage to the second latch stage when the logic relationship of the first and second non-complementary and complementary clock signals changes.

10. The bit shifting circuit of claim 8 wherein the first and second clock circuits comprise:

a first inverter having a first inverter input coupled to receive the input clock signal and a first inverter output;

a second inverter having a second inverter input coupled to first inverter output and a second inverter output;

a first transfer gate having a first input terminal, a first output terminal, a first control terminal coupled to first inverter output, and a first complementary control terminal coupled to the second inverter output;

a second transfer gate having a second input terminal, a second output terminal, a second control terminal coupled to the first inverter output, and a second complementary control terminal coupled to the second inverter output;

a third transfer gate having a third input terminal, a third output terminal, a third control terminal coupled to the first inverter output, and a third complementary control terminal coupled to the second inverter output;

a fourth transfer gate having a fourth input terminal, a fourth output terminal, a fourth control terminal coupled to the second inverter output and, a fourth complementary control terminal coupled to the first inverter output;

a first voltage source coupled to the first and fourth input terminals;

a second voltage source coupled to the second and third input terminals;

a first output buffer having an input coupled to the first and second output terminals, and further having an output to provide a clock signal; and a second output buffer having an input coupled to the third and fourth output terminals, and further having an output to provide an inverted clock signal.

11. The bit shifting circuit of claim 10 wherein the first, second, third, and fourth transfer gates comprise first and second switches coupled in parallel between the input and output, the first switch having a gate terminal coupled to the control terminal and the second switch having a gate terminal coupled to the complementary control terminal.

12. The bit shifting circuit of claim 9 wherein the respective clock signal received by the second clock circuit is a quadrature clock signal of the respective clock signal received by the first clock circuit.

13. A dual-edge triggered bit shifting circuit, comprising:

first and second single-to-dual edge-aligned clock generators, each adapted to receive a respective input clock signal and provide first and second edge-aligned complementary output clock signals generated from the respective input clock signal, each clock generator including:

a first inverter having a first inverter input coupled to receive the input clock signal and a first inverter output;

a second inverter having a second inverter input coupled to first inverter output and a second inverter output;

a first transfer gate having a first input terminal coupled to a first voltage source, a first output terminal, a first control terminal coupled to first inverter output, and a first complementary control terminal coupled to the second inverter output;

a second transfer gate having a second input terminal coupled to a second voltage source, a second output terminal, a second control terminal coupled to the first inverter output, and a second complementary control terminal coupled to the second inverter output;

a third transfer gate having a third input terminal coupled to the second voltage source, a third output terminal, a third control terminal coupled to the first inverter output, and a third complementary control terminal coupled to the second inverter output;

a fourth transfer gate having a fourth input terminal coupled to the first voltage source, a fourth output terminal, a fourth control terminal coupled to the second inverter output, and a fourth complementary control terminal coupled to the first inverter output;

a first output buffer having an input coupled to the first and second output terminals, and further having an output to provide a clock signal; and a second output buffer having an input coupled to the third and fourth output terminals, and further having an output to provide an inverted clock signal; and at least one shift register stage coupled to the output terminals of the first and second clock generators, the at least one shift register stage having an input terminal coupled to receive a data bit and operable to latch the data bit in response to each clock transition of the first edge-aligned complementary clock signals, and further having an output terminal to provide the data bit in response to each clock transition of the second edge-aligned complementary clock signals.

14. The bit shifting circuit of claim 13 wherein the at least one shift register stage comprises:

first and second voltage supplies;

a first inverter circuit having an input terminal coupled to receive the data bit and an output terminal, the first inverter further having first and second supply terminals;

a first latch circuit having an input coupled to the output terminal of the first inverter and further having an output terminal, the first latch latching the data bit in response to the first and second supply terminals being coupled to the first and second voltage supplies, respectively;

a second inverter circuit having an input terminal coupled to the output terminal of the first latch circuit and an output terminal, the second inverter further having third and fourth supply terminals;

a second latch having an input coupled to the output terminal of the second inverter circuit and further having an output terminal to provide the data bit, the second latch latching the data bit in response to the third and fourth supply terminals being coupled to the first and second voltage supplies, respectively; and a switching circuit coupled between the first voltage supply and the first and third supply terminals, and between the second voltage supply and the second and fourth supply terminals, the switching circuit further coupled to receive the first and second edge-aligned complementary output clock signals, the switching circuit alternatively coupling the first and second invellers to both the first and second voltage supplies in response to the first and second edge-aligned complementary clock signals.

15. The bit shifting circuit of claim 14 wherein the switching circuit comprises:

first and second pairs of series connected switches coupled between the first supply terminal and the first voltage supply;

third and fourth pairs of series connected switches coupled between the second supply terminal the second voltage supply;

fifth and sixth pairs of series connected switches coupled between the third supply terminal and the first voltage supply; and seventh and eighth pairs of series connected switches coupled between the fourth supply terminal and the second voltage supply.

16. The bit shifting circuit of claim 15 wherein the first, second, fifth, and sixth pairs of series connected switches comprise a pair of series connected PMOS transistors, and the third, fourth, seventh, and eighth pairs to series connected switches comprise a pair of series connected NMOS transistors.

17. The bit shifting circuit of claim 14 wherein the first and second latches comprise two inverters each having an output terminal coupled to the input terminal of the other inverter.

18. The bit shifting circuit of claim 13 wherein the respective clock signal received by the second single-to-dual edge-aligned clock generator is a quadrature clock signal of the respective clock signal received by the first single-to-dual edge-aligned clock generator.

19. A command buffer for receiving and capturing command words in a memory device, the command buffer comprising:

a shift register having an input terminal, an output terminal, and a clock terminal, the input terminal of the shift register being coupled to an M-bit wide bus, the shift register comprising:

at least one clock generator having a first clock circuit coupled to receive, a first clock signal and a second clock circuit coupled to receive a second clock signal, each clock circuit having first and second output terminals to provide a respective pair of complementary clock signals, each clock circuit further having a first switch alternatively coupling the first output terminal to first and second reference voltages in response to first and second states of the respective clock signal received by the respective clock circuit, and further having a second switch alternatively coupling the second output terminal to the second and first reference voltages in response to the first and second states of the respective clock signal received by the respective clock circuit; and an M number of shift registers, each coupled to receive a respective command bit of the command word and further coupled to the output terminals of the first and second clock circuits, the M number of shift registers each having an N number of shift register stages, each shift register stage having an input terminal coupled to receive the respective command bit and operable to latch the respective command bit in response to the first and second clock signals having a first predetermined relationship, and further having an output terminal to provide the command bit in response to the first and second clock signals having a second predetermined relationship;

a control circuit having a start terminal, a clock terminal, and an output terminal, the control circuit generating a load signal responsive to a predetermined number of clock signals applied to the clock terminal after a start signal has been applied to the start terminal; and a storage register having N*M storage cells each of which has an output terminal, an input terminal coupled to the output of a respective shift register stage, and a load terminal coupled to the output terminal of the control circuit, each of the storage cells storing a signal at the output terminal of the respective shift register stage responsive to the load signal applied to the load terminal of the storage cell, the N*M storage cells collectively outputting a command word.

20. The command buffer of claim 19 wherein the first and second clock circuits comprise:

a first inverter having a first inverter input coupled to receive the input clock signal and a first inverter output;

a second inverter having a second inverter input coupled to first inverter output and a second inverter output;

a first transfer gate having a first input terminal, a first output terminal, a first control terminal coupled to first inverter output, and a first complementary control terminal coupled to the second inverter output;

a second transfer gate having a second input terminal, a second output terminal, a second control terminal coupled to the first inverter output, and a second complementary control terminal coupled to the second inverter output;

a third transfer gate having a third input terminal, a third output terminal, a third control terminal coupled to the first inverter output, and a third complementary control terminal coupled to the second inverter output;

a fourth transfer gate having a fourth input terminal, a fourth output terminal, a fourth control terminal coupled to the second inverter output and, a fourth complementary control terminal coupled to the first inverter output;

a first voltage source coupled to the first and fourth input terminals;

a second voltage source coupled to the second and third input terminals;

a first output buffer having an input coupled to the first and second output terminals, and further having an output to provide a clock signal; and a second output buffer having an input coupled to the third and fourth output terminals, and further having an output to provide an inverted clock signal.

21. The command buffer of claim 19 wherein each shift register stage comprises:

first and second voltage supplies;

a first inverter circuit having an input terminal coupled to receive the respective command bit and an output terminal, the first inverter further having first and second supply terminals;

a first latch circuit having an input coupled to the output terminal of the first inverter and further having an output terminal, the first latch latching the respective command bit in response to the first and second supply terminals being coupled to the first and second voltage supplies, respectively;

a second inverter circuit having an input terminal coupled to the output terminal of the first latch circuit and an output terminal, the second inverter further having third and fourth supply terminals;

a second latch having an input coupled to the output terminal of the second inverter circuit and further having an output terminal to provide the respective command bit, the second latch latching the respective command bit in response to the third and fourth supply terminals being coupled to the first and second voltage supplies, respectively; and a switching circuit coupled between the first voltage supply and the first and third supply terminals, and between the second voltage supply and the second and fourth supply terminals, the switching circuit further coupled to receive the first and second edge-aligned complementary clock signals, the switching circuit alternatively coupling the first and second inverters to both the first and second voltage supplies in response to the first and second edge-aligned complementary clock signals.

22. A memory device, comprising:

at least one array of memory cells adapted to store data at a location determined by a row address and a column address responsive to a command word;

a row address circuit adapted to receive and decode the row address, and select a row of memory cells corresponding to the row address responsive to the command word;

a column address circuit adapted to receive or apply data to one of the memory cells in the selected row corresponding to the column address responsive to the command word;

a data path circuit adapted to couple data between an external terminal and the column address circuit responsive to the command word; and a command word generator generating the command word responsive to a command packet of N M-bit words received on an M-bit bus, the command word generator comprising:

a shift register having an input terminal, an output terminal, and a clock terminal, the input terminal of the shift register being coupled to the M-bit wide bus, the shift register comprising:

at least one clock generator having a first clock circuit coupled to receive a first clock signal and a second clock circuit coupled to receive a second clock signal, each clock circuit having first and second output terminals to provide a respective pair of complementary clock signals, each clock circuit further having a first switch alternatively coupling the first output terminal to first and second reference voltages in response to first and second states of the respective clock signal received by the respective clock circuit, and further having a second switch alternatively coupling the second output terminal to the second and first reference voltages in response to the first and second states of the respective clock signal received by the respective clock circuit; and an M number of shift registers, each coupled to receive a respective command bit of the command word and further coupled to the output terminals of the first and second clock circuits, the M number of shift registers each having an N number of shift register stages, each shift register stage having an input terminal coupled to receive the respective command bit and operable to latch the respective command bit in response to the first and second clock signals having a first predetermined relationship, and further having an output terminal to provide the command bit in response to the first and second clock signals having a second predetermined relationship;

a control circuit having a start terminal, a clock terminal, and an output terminal, the control circuit generating a load signal responsive to a predetermined number of clock signals applied to the clock terminal after a start signal has been applied to the start terminal; and a storage register having N*M storage cells each of which has an output terminal, an input terminal coupled to the output of a respective shift register stage, and a load terminal coupled to the output terminal of the control circuit, each of the storage cells storing a signal at the output terminal of the respective shift register stage responsive to the load signal applied to the toad terminal of the storage cell, the N*M storage cells collectively outputting a command word.

23. The memory device of claim 22 wherein the first and second clock circuits comprise:

a first inverter having a first inverter input coupled to receive the input clock signal and a first inverter output;

a second inverter having a second inverter input coupled to first inverter output and a second inverter output;

a first transfer gate having a first input terminal, a first output terminal, a first control terminal coupled to first inverter output, and a first complementary control terminal coupled to the second inverter output;

a second transfer gate having a second input terminal, a second output terminal, a second control terminal coupled to the first inverter output, and a second complementary control terminal coupled to the second inverter output;

a third transfer gate having a third input terminal, a third output terminal, a third control terminal coupled to the first inverter output, and a third complementary control terminal coupled to the second inverter output;

a fourth transfer gate having a fourth input terminal, a fourth output terminal, a fourth control terminal coupled to the second inverter output and, a fourth complementary control terminal coupled to the first inverter output;

a first voltage source coupled to the first and fourth input terminals;

a second voltage source coupled to the second and third input terminals;

a first output buffer having an input coupled to the first and second output terminals, and further having an output to provide a clock signal; and a second output buffer having an input coupled to the third and fourth output terminals, and further having an output to provide an inverted clock signal.

24. The memory device of claim 22 wherein each shift register stage comprises:

first and second voltage supplies;

a first inverter circuit having an input terminal coupled to receive the respective command bit and an output terminal, the first inverter further having first and second supply terminals;

a first latch circuit having an input coupled to the output terminal of the first inverter and further having an output terminal, the first latch latching the respective command bit in response to the first and second supply terminals being coupled to the first and second voltage supplies, respectively;

a second inverter circuit having an input terminal coupled to the output terminal of the first latch circuit and an output terminal, the second inverter further having third and fourth supply terminals;

a second latch having an input coupled to the output terminal of the second inverter circuit and further having an output terminal to provide the respective command bit, the second latch latching the respective command bit in response to the third and fourth supply terminals being coupled to the first and second voltage supplies, respectively; and a switching circuit coupled between the first voltage supply and the first and third supply terminals, and between the second voltage supply and the second and fourth supply terminals, the switching circuit further coupled to receive the first and second edge-aligned complementary clock signals, the switching circuit alternatively coupling the first and second inverters to both the first and second voltage supplies in response to the first and second edge-aligned complementary clock signals.

25. A computer system, comprising:

a processor having a processor bus;

an input device coupled to the processor through the processor bus and adapted to allow data to be entered into the computer system;

an output device coupled to the processor through the processor bus adapted to allow data to be output from the computer system; and a memory device coupled to the processor through the processor bus, comprising:

at least one array of memory cells adapted to store data at a location determined by a row address and a column address responsive to a command word;

a row address circuit adapted to receive and decode the row address, and select a row of memory cells corresponding to the row address responsive to the command word;

a column address circuit adapted to receive or apply data to one of the memory cells in the selected row corresponding to the column address responsive to the command word;

a data path circuit adapted to couple data between an external terminal and the column address circuit responsive to a the command word; and a command word generator generating the command word responsive to a command packet of N M-bit words received on an M-bit bus, the command word generator comprising:

a shift register having an input terminal, an output terminal, and a clock terminal, the input terminal of the shift register being coupled to the M-bit wide bus, the shift register comprising:

at least one clock generator having a first clock circuit coupled to receive a first clock signal and a second clock circuit coupled to receive a second clock signal, each clock circuit having first and second output terminals to provide a respective pair of complementary clock signals, each clock circuit further having a first switch alternatively coupling the first output terminal to first and second reference voltages in response to first and second states of the respective clock signal received by the respective clock circuit, and further having a second switch alternatively coupling the second output terminal to the second and first reference voltages in response to the first and second states of the respective clock signal received by the respective clock circuit; and an M number of shift registers, each coupled to receive a respective command bit of the command word and further coupled to the output terminals of the clock circuit, the M number of shift registers each having an N number of shift register stages, each shift register stage having an input terminal coupled to receive the respective command bit and operable to latch the respective command bit in response to each clock transition of the first edge-aligned complementary clock signals, and further having an output terminal to provide the command bit in response to each clock transition of the second edge-aligned complementary clock signals;

a control circuit having a start terminal, a clock terminal, and an output terminal, the control circuit generating a load signal responsive to a predetermined number of clock signals applied to the clock terminal after a start signal has been applied to the start terminal; and a storage register having N*M storage cells each of which has an output terminal, an input terminal coupled to the output of a respective shift register stage, and a load terminal coupled to the output terminal of the control circuit, each of the storage cells storing a signal at the output terminal of the respective shift register stage responsive to the load signal applied to the load terminal of the storage cell, the N*M storage cells collectively outputting a command word.

26. A The computer system of claim 25 wherein the first and second clock circuits comprise:

a first inverter having a first inverter input coupled to receive the input clock signal and a first inverter output;

a second inverter having a second inverter input coupled to first inverter output and a second inverter output;

a first transfer gate having a first input terminal, a first output terminal, a first control terminal coupled to first inverter output, and a first complementary control terminal coupled to the second inverter output;

a second transfer gate having a second input terminal, a second output terminal, a second control terminal coupled to the first inverter output, and a second complementary control terminal coupled to the second inverter output;

a third transfer gate having a third input terminal, a third output terminal, a third control terminal coupled to the first inverter output, and a third complementary control terminal coupled to the second inverter output;

a fourth transfer gate having a fourth input terminal, a fourth output terminal, a fourth control terminal coupled to the second inverter output and, a fourth complementary control terminal coupled to the first inverter output;

a first voltage source coupled to the first and fourth input terminals;

a second voltage source coupled to the second and third input terminals;

a first output buffer having an input coupled to the first and second output terminals, and further having an output to provide a clock signal; and a second output buffer having an input coupled to the third and fourth output terminals, and further having an output to provide an inverted clock signal.

27. The computer system of claim 25 wherein each shift register stage comprises:

first and second voltage supplies;

a first inverter circuit having an input terminal coupled to receive the respective command bit and an output terminal, the first inverter further having first and second supply terminals;

a first latch circuit having an input coupled to the output terminal of the first inverter and further having an output terminal, the first latch latching the respective command bit in response to the first and second supply terminals being coupled to the first and second voltage supplies, respectively;

a second inverter circuit having an input terminal coupled to the output terminal of the first latch circuit and an output terminal, the second inverter further having third and fourth supply terminals;

a second latch having an input coupled to the output terminal of the second inverter circuit and further having an output terminal to provide the respective command bit, the second latch latching the respective command bit in response to the third and fourth supply terminals being coupled to the first and second voltage supplies, respectively; and a switching circuit coupled between the first voltage supply and the first and third supply terminals, and between the second voltage supply and the second and fourth supply terminals, the switching circuit further coupled to receive the first and second edge-aligned complementary clock signals, the switching circuit alternatively coupling the first and second inverters to both the first and second voltage supplies in response to the first and second edge-aligned complementary clock signals.

28. A method of shifting a data bit comprising:

generating first and second pairs of low-skew complementary clock signals;

coupling a first logic circuit receiving the data bit to first and second reference voltages in response to each clock transition of the first pair of low-skew complementary clock signals;

latching the data bit at the output of the first logic circuit;

coupling a second, logic circuit receiving the latched data bit to the first and second reference voltages in response to each clock transition of the second pair of low-skew complementary clock signals; and latching the data bit at the output of the second logic circuit.

29. The method of claim 28 wherein generating comprises:

alternatively coupling a first node to a first reference terminal and a second node to a second reference terminal, and coupling the first node to the second reference terminal and the second node to the first reference terminal; and triggering a first buffer circuit coupled to the first node and a second buffer circuit coupled to the second node.

30. The method of claim 28 wherein the coupling of the first and second logic circuits comprise closing a pair of switches in response to the first and second pairs of low-skew and complementary clock signals.

31. The method of claim 30 wherein closing a pair of switches comprises closing one switch before the other.

32. A method of shifting a data bit comprising:

aligning the clock edges of a first set of complementary clock signals;

aligning the clock edges of a second set of complementary clock signals;

coupling a first complementary switch pair to first and second supply terminals in response to clock transitions of the first and second complementary clock signals;

latching the data bit in a first latch circuit in response to the clock transition of the first set of complementary clock signals;

coupling a second complementary switch pair to the first and second supply terminals in response to clock transitions of the first and second complementary clock signals; and latching the data bit from the first latch circuit in a second latch circuit in response to the clock transition of the second set of complementary clock signals.

33. The method of claim 32 wherein aligning the clock edges of the first and second set of complementary clock signals comprises alternatively coupling a first buffer circuit to a first reference voltage and a second buffer circuit to a second reference voltage, and coupling the first buffer circuit to the second reference voltage and the second buffer circuit to the first reference voltage in response to a transition of an input clock signal.

34. A dual-edge triggered bit shifting circuit, comprising:
first and second single-to-dual edge-aligned clock generators, each having an input terminal coupled to receive a respective input clock signal and output terminals to provide first and second edge-aligned complementary output clock signals generated from the respective input clock signal; and
at least one shift register stage coupled to the output terminals of the first and second clock generators and adapted to latch a data bit in response to each clock transition of the first edge-aligned complementary clock signals, the shift register stage further adapted to provide the data bit in response to each clock transition of the second edge-aligned complementary clock signals, the shift register stage including:
 a first inverter circuit having an input terminal coupled to receive the data bit and an output terminal, the first inverter further having first and second supply terminals;
 a first latch circuit having an input coupled to the output terminal of the first inverter and further having an output terminal, the first latch latching the data bit in response to the first and second supply terminals being coupled to first and second voltage supplies, respectively;
 a second inverter circuit having an input terminal coupled to the output terminal of the first latch circuit and an output terminal, the second inverter further having third and fourth supply terminals; and
 a second latch having an input coupled to the output terminal of the second inverter circuit and further having an output terminal to provide the data bit, the second latch latching the data bit in response to the third and fourth supply terminals being coupled to the first and second voltage supplies, respectively; and
 a switching circuit coupled between the first voltage supply and the first and third supply terminals, and between the second voltage supply and the second and fourth supply terminals, the switching circuit further coupled to receive the first and second edge-aligned complementary output clock signals, the switching circuit alternatively coupling the first and second inverters to both the first and second voltage supplies in response to the first and second edge-aligned complementary clock signals.

35. The bit shifting circuit of claim 34 wherein the first and second single-to-dual edge-aligned clock generators comprise:
 a first inverter having a first inverter input coupled to receive the input clock signal and a first inverter output;
 a second inverter having a second inverter input coupled to first inverter output and a second inverter output;
 a first transfer gate having a first input terminal, a first output terminal, a first control terminal coupled to first inverter output, and a first complementary control terminal coupled to the second inverter output;
 a second transfer gate having a second input terminal, a second output terminal, a second control terminal coupled to the first inverter output, and a second complementary control terminal coupled to the second inverter output;
 a third transfer gate having a third input terminal, a third output terminal, a third control terminal coupled to the first inverter output, and a third complementary control terminal coupled to the second inverter output;
 a fourth transfer gate having a fourth input terminal, a fourth output terminal, a fourth control terminal coupled to the second inverter output and, a fourth complementary control terminal coupled to the first inverter output;
 a first voltage source coupled to the first and fourth input terminals;
 a second voltage source coupled to the second and third input terminals;
 a first output buffer having an input coupled to the first and second output terminals, and further having an output to provide a clock signal; and
 a second output buffer having an input coupled to the third and fourth output terminals, and further having an output to provide an inverted clock signal.

36. The bit shifting circuit of claim 34 wherein the switching circuit comprises:
 first and second pairs of series connected switches coupled between the first supply terminal and the first voltage supply;
 third and fourth pairs of series connected switches coupled between the second supply terminal the second voltage supply;
 fifth and sixth pairs of series connected switches coupled between the third supply terminal and the first voltage supply; and
 seventh and eighth pairs of series connected switches coupled between the fourth supply terminal and the second voltage supply.

37. The bit shifting circuit of claim 36 wherein the first, second, fifth, and sixth pairs of series connected switches comprise a pair of series connected PMOS transistors, and the third, fourth, seventh, and eighth pairs to series connected switches comprise a pair of series connected NMOS transistors.

38. The bit shifting circuit of claim 34 wherein the first and second latches comprise two inverters each having an output terminal coupled to the input terminal of the other inverter.

39. The bit shifting circuit of claim 34 wherein the respective clock signal received by the second single-to-dual edge-aligned clock generator is a quadrature clock signal of the respective clock signal received by the first single-to-dual edge-aligned clock generator.

40. A dual-edge triggered bit shifting circuit, comprising:
first and second single-to-dual edge-aligned clock generators, each having an input terminal coupled to receive a respective input clock signal and output terminals to provide first and second edge-aligned complementary output clock signals generated from the respective input clock signal, the clock signal received by the second single-to-dual edge-aligned clock generator being a quadrature clock signal of the clock signal received by the first single-to-dual edge-aligned clock generator; and
at least one shift register stage coupled to the output terminals of the first and second clock generators, the at least one shift register stage having an input terminal coupled to receive a data bit and operable to latch the data bit in response to each clock transition of the first edge-aligned complementary clock signals, and further having an output terminal to provide the data bit in response to each clock transition of the second edge-aligned complementary clock signals.

41. The bit shifting circuit of claim 40 wherein the first and second single-to-dual edge-aligned clock generators comprise:
- a first inverter having a first inverter input coupled to receive the input clock signal and a first inverter output;
- a second inverter having a second inverter input coupled to first inverter output and a second inverter output;
- a first transfer gate having a first input terminal, a first output terminal, a first control terminal coupled to first inverter output, and a first complementary control terminal coupled to the second inverter output;
- a second transfer gate having a second input terminal, a second output terminal, a second control terminal coupled to the first inverter output, and a second complementary control terminal coupled to the second inverter output;
- a third transfer gate having a third input terminal, a third output terminal, a third control terminal coupled to the first inverter output, and a third complementary control terminal coupled to the second inverter output;
- a fourth transfer gate having a fourth input terminal, a fourth output terminal, a fourth control terminal coupled to the second inverter output and, a fourth complementary control terminal coupled to the first inverter output;
- a first voltage source coupled to the first and fourth input terminals;
- a second voltage source coupled to the second and third input terminals;
- a first output buffer having an input coupled to the first and second output terminals, and further having an output to provide a clock signal; and
- a second output buffer having an input coupled to the third and fourth output terminals, and further having an output to provide an inverted clock signal.

42. The bit shifting circuit of claim 40 wherein the at least one shift register stage comprises:
- first and second voltage supplies;
- a first inverter circuit having an input terminal coupled to receive the data bit and an output terminal, the first inverter further having first and second supply terminals;
- a first latch circuit having an input coupled to the output terminal of the first inverter and further having an output terminal, the first latch latching the data bit in response to the first and second supply terminals being coupled to the first and second voltage supplies, respectively;
- a second inverter circuit having an input terminal coupled to the output terminal of the first latch circuit and an output terminal, the second inverter further having third and fourth supply terminals;
- a second latch having an input coupled to the output terminal of the second inverter circuit and further having an output terminal to provide the data bit, the second latch latching the data bit in response to the third and fourth supply terminals being coupled to the first and second voltage supplies, respectively; and
- a switching circuit coupled between the first voltage supply and the first and third supply terminals, and between the second voltage supply and the second and fourth supply terminals, the switching circuit further coupled to receive the first and second edge-aligned complementary output clock signals, the switching circuit alternatively coupling the first and second inverters to both the first and second voltage supplies in response to the first and second edge-aligned complementary clock signals.

43. The bit shifting circuit of claim 42 wherein the switching circuit comprises:
- first and second pairs of series connected switches coupled between the first supply terminal and the first voltage supply;
- third and fourth pairs of series connected switches coupled between the second supply terminal the second voltage supply;
- fifth and sixth pairs of series connected switches coupled between the third supply terminal and the first voltage supply; and
- seventh and eighth pairs of series connected switches coupled between the fourth supply terminal and the second voltage supply.

44. The bit shifting circuit of claim 43 wherein the first, second, fifth, and sixth pairs of series connected switches comprise a pair of series connected PMOS transistors, and the third, fourth, seventh, and eighth pairs to series connected switches comprise a pair of series connected NMOS transistors.

45. The bit shifting circuit of claim 42 wherein the first and second latches comprise two inverters each having an output terminal coupled to the input terminal of the other inverter.

46. A balanced dual edge triggered bit shifting circuit, comprising:
- first and second clock circuits, each adapted to receive a single respective clock signal and provide first and second pairs of complementary clock signals generated from the respective clock signal, each clock circuit including:
  - a first inverter having a first inverter input coupled to receive the input clock signal and further having a first inverter output;
  - a second inverter having a second inverter input coupled to first inverter output and further having a second inverter output;
  - a first transfer gate having a first input terminal, a first output terminal, a first control terminal coupled to first inverter output, and a first complementary control terminal coupled to the second inverter output;
  - a second transfer gate having a second input terminal, a second output terminal, a second control terminal coupled to the first inverter output, and a second complementary control terminal coupled to the second inverter output;
  - a third transfer gate having a third input terminal, a third output terminal, a third control terminal coupled to the first inverter output, and a third complementary control terminal coupled to the second inverter output;
  - a fourth transfer gate having a fourth input terminal, a fourth output terminal, a fourth control terminal coupled to the second inverter output and, a fourth complementary control terminal coupled to the first inverter output;
  - a first voltage source coupled to the first and fourth input terminals;
  - a second voltage source coupled to the second and third input terminals;
  - a first output buffer having an input coupled to the first and second output terminals, and further having an output to provide a clock signal; and a second output buffer having an input coupled to the third and fourth output terminals, and further having an output to provide an inverted clock signal; and a shift register having input and output terminals, and further having plurality of shift register stages coupled in series between the input and output terminals, each shift register stage having input and output terminals and shifting an input bit from the input terminal to the output terminal in response to the first and second pairs of complementary clock signals.

47. The bit shifting circuit of claim 46 wherein each shift register stage comprises:

a first latch stage coupled to receive a data bit, the first latch stage latching the data bit in response to a first logic relationship of the first and second pairs of complementary clock signals; and a second latch stage coupled to receive the data bit from the first latch stage, the second latch stage latching the data bit in response to a second logic relationship of the first and second pairs of complementary clock signals, whereby the data bit is shifted from the first latch stage to the second latch stage when the logic relationship of the first and second pairs of complementary clock signals changes.

48. The bit shifting circuit of claim 46 wherein the first and second latch stages comprise:

an inverter having an input terminal coupled to receive the data bit and an output terminal, the inverter further having first and second supply terminals;

first and second pairs of series connected switches coupled between a first reference terminal and the first supply terminal of the inverter, and having control terminals coupled to receive the first and second pairs of complementary clock signals;

third and fourth pairs of series connected switches coupled between the second supply terminal of the inverter and a second reference terminal, and having control terminals coupled to receive the first and second pairs of complementary clock signals; and a latch coupled to the output of the inverter to latch the data bit in response to the inverter being activated when one of the first or second and one of the third or fourth pairs of series connected switches are simultaneously conductive.

49. The bit shifting circuit of claim 48 wherein the first, second, third, and fourth transfer gates comprise first and second switches coupled in parallel between the input and output, the first switch having a gate terminal coupled to the control terminal and the second switch having a gate terminal coupled to the complementary control terminal.

50. The bit shifting circuit of claim 46 wherein the respective clock signal received by the second clock circuit is a quadrature clock signal of the respective clock signal received by the first clock circuit.

51. A dual-edge triggered bit shifting circuit, comprising:

a clock generator having a first clock circuit coupled to receive a first clock signal and a second clock circuit coupled to receive a second clock signal, each clock circuit adapted to provide a respective pair of complementary clock signals, each clock circuit further having a first switch alternatively coupling the first output terminal to first and second reference voltages in response to first and second states of the respective clock signal received by the respective clock circuit, and further having a second switch alternatively coupling the second output terminal to the second and first reference voltages in response to the first and second states of the respective clock signal received by the respective clock circuit, each clock circuit including:

a first inverter having an input coupled to receive a respective clock signal and further having an output;

a second inverter having an input coupled to the output of the first inverter and further having an output;

first, second, third, and fourth transfer gates, each transfer gate including first and second switches coupled in parallel between an input and an output terminal, the first switch having a first gate terminal and the second switch having a second gate terminal, wherein the input terminals of the first and fourth transfer gates are coupled to a first reference terminal, the input terminals of the second and third transfer gates are coupled to a second reference terminal, the output of the first inverter is coupled to the first gate terminals of the first and third transfer gates, and to the second gate terminals of the second and fourth transfer gates, and the output of the second inverter is coupled to the first gate terminals of the second and fourth transfer gates, and to the second gate terminals of the first and third transfer gates;

a first output buffer having an input coupled to the output terminal of the first and second transfer gates, and further having an output terminal to provide a clock signal; and a second output buffer having an input coupled to the output terminal of the third and fourth transfer gates, and further having an output terminal to provide a complementary clock signal; and a shift register coupled to the output terminals of the first and second clock generators, and further having an input terminal coupled to receive an input bit in response to the first and second clock signals having a first predetermined relationship and an output terminal to provide an output bit in response to the first and second clock signals having a second predetermined relationship.

52. The bit shifting circuit of claim 51 wherein the shift register comprises a plurality of shift register stages coupled in series between the input and output terminals of the shift register, each shift register stage having input and output terminals and adapted to shift the input bit from the input terminal to the output terminal in response to the first and second pairs of complementary clock signals from the clock generator.

53. The bit shifting circuit of claim 52 wherein each shift register stage comprises:

a first latch stage coupled to receive a data bit, the first latch stage latching the data bit in response to the first and second pairs of complementary clock signals having a first predetermined logic relationship; and a second latch stage coupled to receive the data bit from the first latch stage, the second latch stage latching the data bit in response to the first and second pairs of complementary clock signals having a second predetermined logic relationship, whereby the data bit is shifted from the first latch stage to the second latch stage when the predetermined logic relationship of the first and second pairs of complementary clock signals changes.

54. The bit shifting circuit of claim 53 wherein the first and second latch stages comprise:

an inverter having an input terminal coupled to receive the data bit and an output terminal, the inverter further having first and second supply terminals;

a first switching circuit coupled between a first reference terminal and the first supply terminal of the inverter, and further coupled to receive the first and second pairs of complementary clock signals, the first switching, circuit coupling the first reference terminal to the first supply terminal in response to the predetermined logic relationship of the first and second pairs of complementary clock signals;

a second switching circuit coupled between the second supply terminal of the inverter and a second reference terminal, and further coupled to receive the first and second pairs of complementary clock signals, the second switching circuit coupling second supply terminal to the second reference terminal in response to the predetermined logic relationship of the first and second pairs of complementary clock signals; and a latch circuit coupled to the output of the inverter to latch the data bit in response to the first and second supply terminals of the inverter being coupled through the first and second switching circuits to the first and second reference terminals, respectively.

55. The bit shifting circuit of claim 54 wherein the first switching circuit comprises first and second pairs of series connected switches, each pair coupled between the first reference terminal and the first supply terminal, each switch having a control terminal coupled to receive a respective clock signal from the clock generator, and the second switching circuit comprises first and second pairs of series connected switches, each pair coupled between the second reference terminal and the second supply terminal, each switch having a control terminal coupled to receive a respective clock signal from the clock generator.

56. The bit shifting circuit of claim 55 wherein the first and second pairs of switches of the first switching circuit comprises PMOS transistors, and the first and second pairs of switches of the second switching circuit comprises NMOS transistors.

57. The bit shifting circuit of claim 54 wherein the latch circuit comprises two inverters each having an output terminal coupled to the input terminal of the other inverter.

58. The bit shifting circuit of claim 51 wherein the second clock signal is a quadrature clock signal of the first clock signal.

* * * * *

UNITED STATES PATENT AND TRADEMARK OFFICE
CERTIFICATE OF CORRECTION

PATENT NO.  : 6,301,322 B1
DATED       : October 9, 2001
INVENTOR(S) : Troy A. Manning It is certified that error appears in the above-identified patent and that said Letters Patent is hereby corrected as shown below:

Column 12,
Line 11, reads "coupling" should read -- coupling the --

Column 13,
Lines 61 and 63, reads "to first" should read -- to the first --

Column 14,
Line 29, reads "claim 9" should read -- claim 8 --
Lines 43 and 46, reads "to first" should read -- to the first --

Column 15,
Lines 42 and 43, reads "invellers" should read -- inverters --
Line 52, reads "terminal the" should read -- terminal and the --

Column 16,
Line 18, reads "receive," should read -- receive --
Line 24, reads "to first" should read -- to a first --
Lines 64 and 65, reads "to first" should read -- to the first --

Column 18,
Line 59, reads "toad" should read -- load --
Line 67, reads "to first" should read -- to a first --

Column 19,
Line 2, reads "to first" should read -- to the first --

Column 20,
Line 19, reads "to a the" should read -- to a --

Column 21,
Lines 15 and 17, reads "to first" should read -- to the first --

Column 22,
Line 22, reads "second," should read -- second --

UNITED STATES PATENT AND TRADEMARK OFFICE
CERTIFICATE OF CORRECTION

PATENT NO.    : 6,301,322 B1
DATED         : October 9, 2001
INVENTOR(S)   : Troy A. Manning It is certified that error appears in the above-identified patent and that said Letters Patent is hereby corrected as shown below:

Column 24,
Line 24, reads "terminal the" should read -- terminal and the --

Column 29,
Line 4, reads "switching," should read -- switching --

Signed and Sealed this

Seventeenth Day of September, 2002

Attest:

JAMES E. ROGAN
Director of the United States Patent and Trademark Office

Attesting Officer